United States Patent
Sasaki

(10) Patent No.: US 10,564,229 B2
(45) Date of Patent: Feb. 18, 2020

(54) TUNNEL MAGNETORESISTIVE EFFECT ELEMENT, MAGNETIC MEMORY, AND BUILT-IN MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/080,910

(22) PCT Filed: Oct. 16, 2017

(86) PCT No.: PCT/JP2017/037420
§ 371 (c)(1),
(2) Date: Aug. 29, 2018

(87) PCT Pub. No.: WO2019/077663
PCT Pub. Date: Apr. 25, 2019

(65) Prior Publication Data
US 2019/0178956 A1    Jun. 13, 2019

(51) Int. Cl.
*G01R 33/09* (2006.01)
*H01L 27/22* (2006.01)
*G11C 11/16* (2006.01)
*H01L 43/10* (2006.01)
*H01L 43/08* (2006.01)

(52) U.S. Cl.
CPC .......... *G01R 33/098* (2013.01); *G11C 11/161* (2013.01); *H01L 27/228* (2013.01); *H01L 43/08* (2013.01); *H01L 43/10* (2013.01)

(58) Field of Classification Search
CPC ............................ G01R 33/098; G11C 11/161

USPC .......................................................... 257/421
See application file for complete search history.

(56) References Cited

U.S. PATENT DOCUMENTS

| | | | |
|---|---|---|---|
| 8,860,156 B2 | 10/2014 | Beach et al. | |
| 8,921,961 B2 | 12/2014 | Kula et al. | |
| 9,006,704 B2 | 4/2015 | Jan et al. | |
| 10,014,465 B1* | 7/2018 | Liu | H01L 43/12 |
| 2009/0161422 A1 | 6/2009 | Zhu et al. | |
| 2010/0020592 A1* | 1/2010 | Hosotani | G11C 11/161 365/158 |
| 2012/0091548 A1 | 4/2012 | Sukegawa et al. | |
| 2012/0320666 A1 | 12/2012 | Ohno et al. | |
| 2013/0221459 A1* | 8/2013 | Jan | H01L 43/08 257/421 |
| 2013/0221461 A1 | 8/2013 | Sukegawa et al. | |

(Continued)

FOREIGN PATENT DOCUMENTS

| | | |
|---|---|---|
| JP | 2011-508971 A | 3/2011 |
| JP | 5586028 B2 | 9/2014 |

(Continued)

*Primary Examiner* — Igwe U Anya
(74) *Attorney, Agent, or Firm* — Oliff PLC

(57) ABSTRACT

A TMR element includes a reference layer, a tunnel barrier layer, a perpendicular magnetization inducing layer, and a magnetization free layer stacked along a stack direction between the tunnel barrier layer and the perpendicular magnetization inducing layer. The perpendicular magnetization inducing layer imparts magnetic anisotropy along the stack direction to the magnetization free layer. The width of the magnetization free layer is smaller than any of the width of the tunnel barrier layer or the width of the perpendicular magnetization inducing layer.

20 Claims, 16 Drawing Sheets

(56) References Cited

U.S. PATENT DOCUMENTS

| | | | | |
|---|---|---|---|---|
| 2014/0116984 A1* | 5/2014 | Ding | .................... | G11B 5/3116 |
| | | | | 216/22 |
| 2014/0284736 A1* | 9/2014 | Toko | ...................... | H01L 43/08 |
| | | | | 257/421 |
| 2015/0213816 A1* | 7/2015 | Okawa | ................ | G01R 33/098 |
| | | | | 360/319 |
| 2016/0043305 A1* | 2/2016 | Ochiai | ................... | H01L 43/08 |
| | | | | 257/421 |
| 2016/0079518 A1* | 3/2016 | Pi | ........................... | H01L 43/10 |
| | | | | 257/421 |
| 2017/0025600 A1 | 1/2017 | Ohno et al. | | |
| 2019/0180900 A1* | 6/2019 | Sasaki | ................ | H01F 10/3259 |

FOREIGN PATENT DOCUMENTS

| | | |
|---|---|---|
| JP | 2014-207469 A | 10/2014 |
| JP | 2015-038998 A | 2/2015 |
| JP | 5988019 B2 | 9/2016 |

\* cited by examiner

*Fig.6*
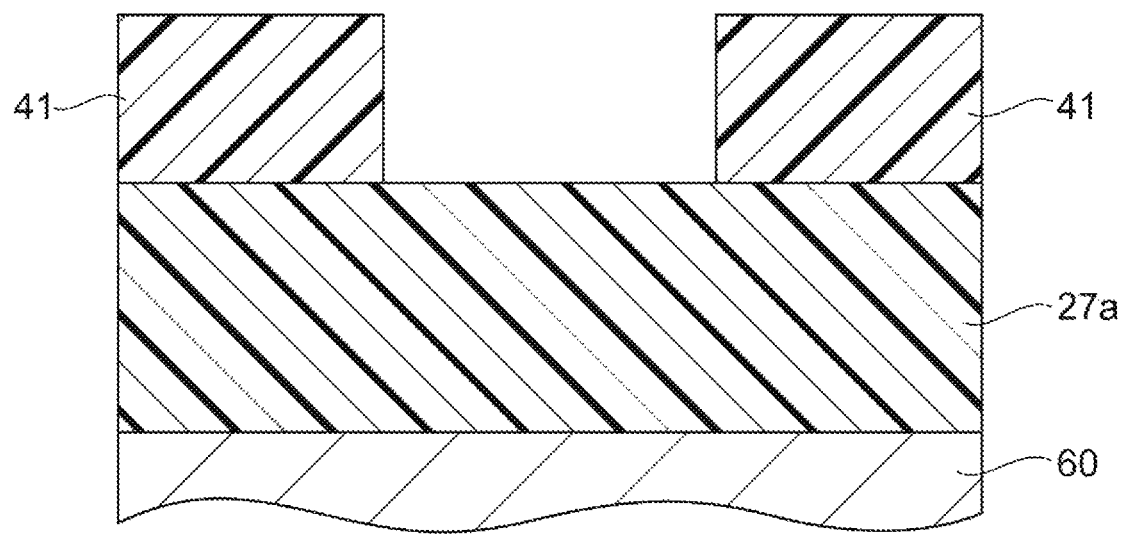
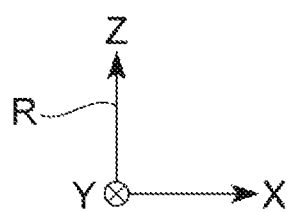

Fig.7
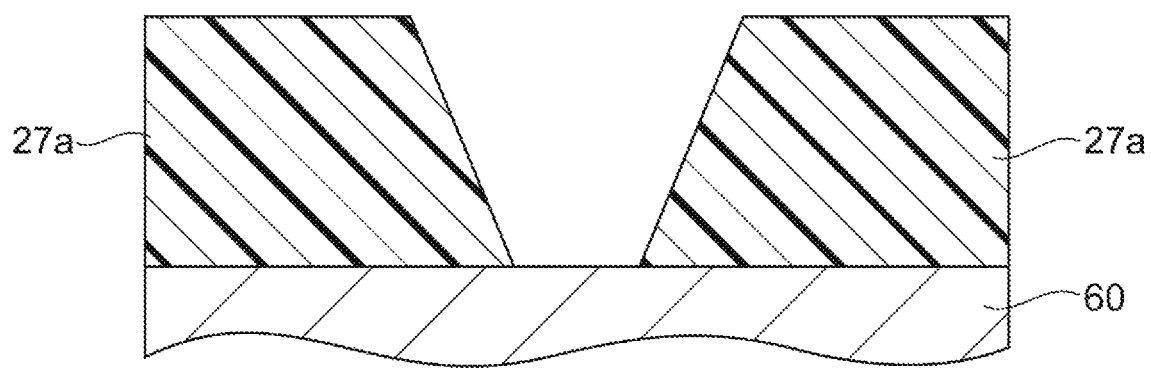
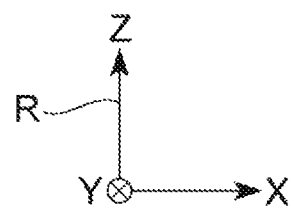

Fig.8
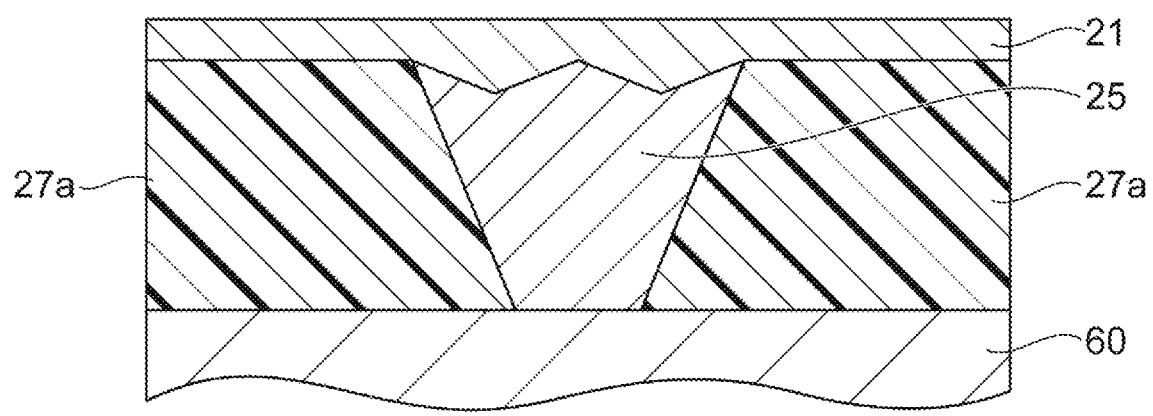
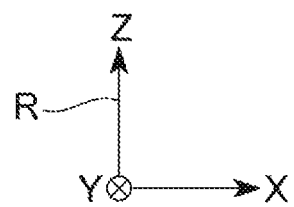

Fig.9
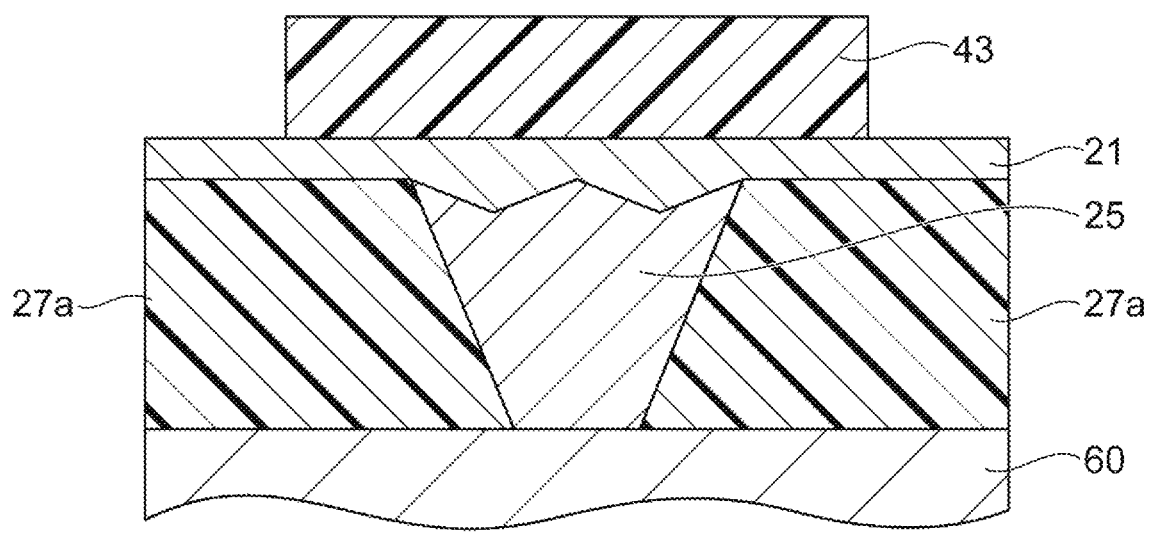
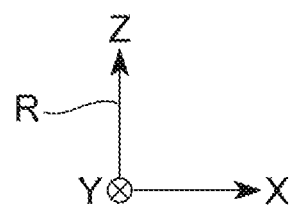

Fig.10
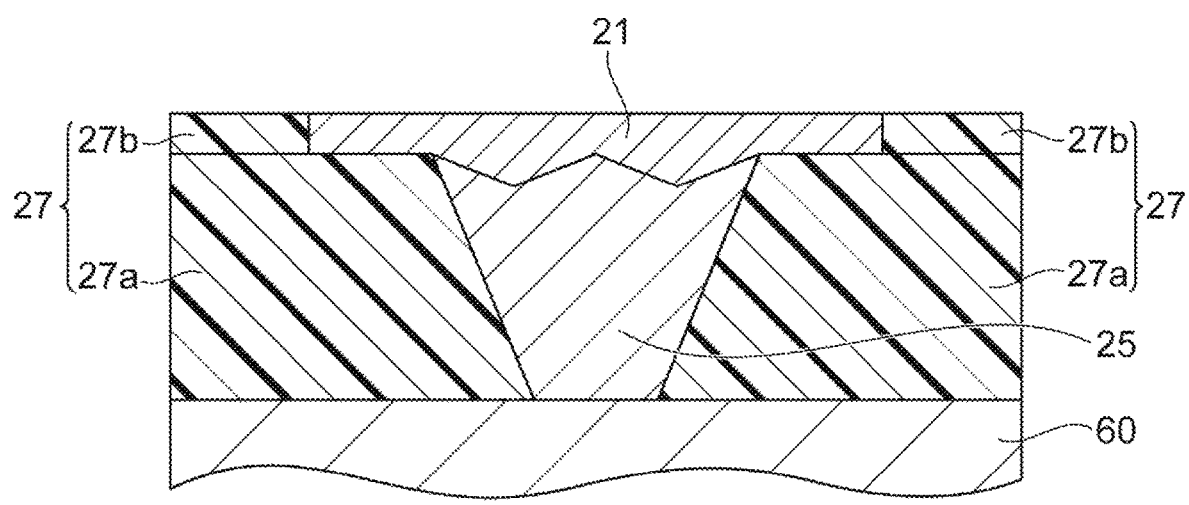
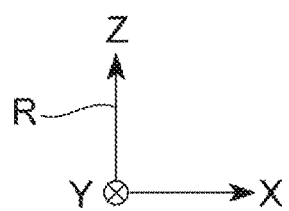

Fig.13
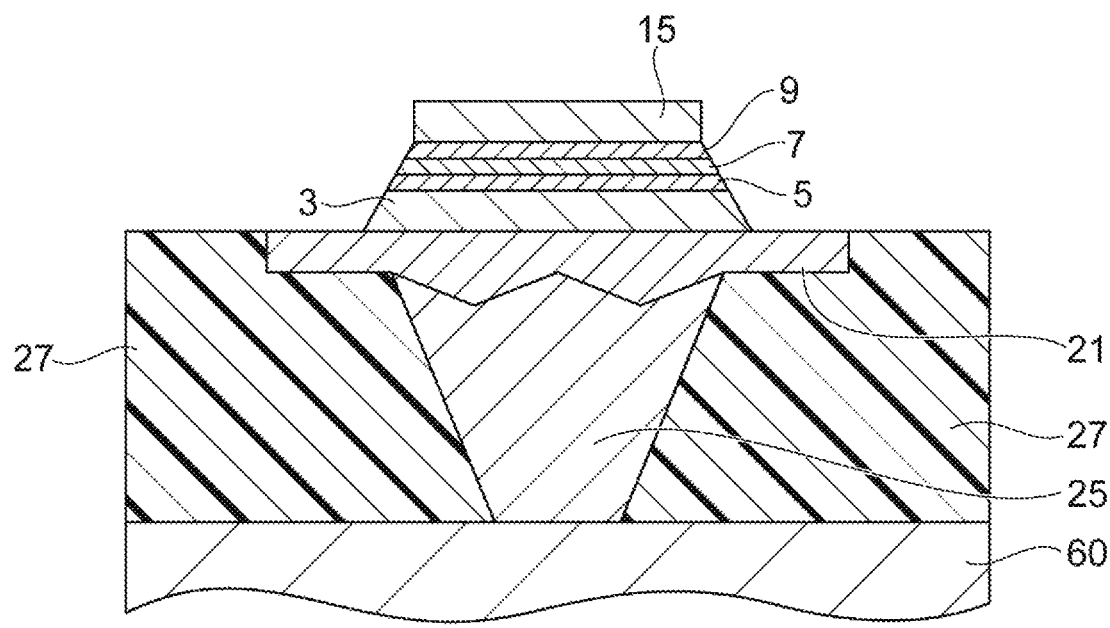
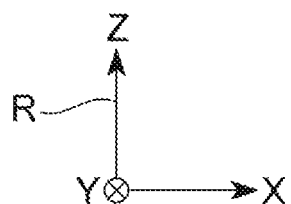

*Fig.14*
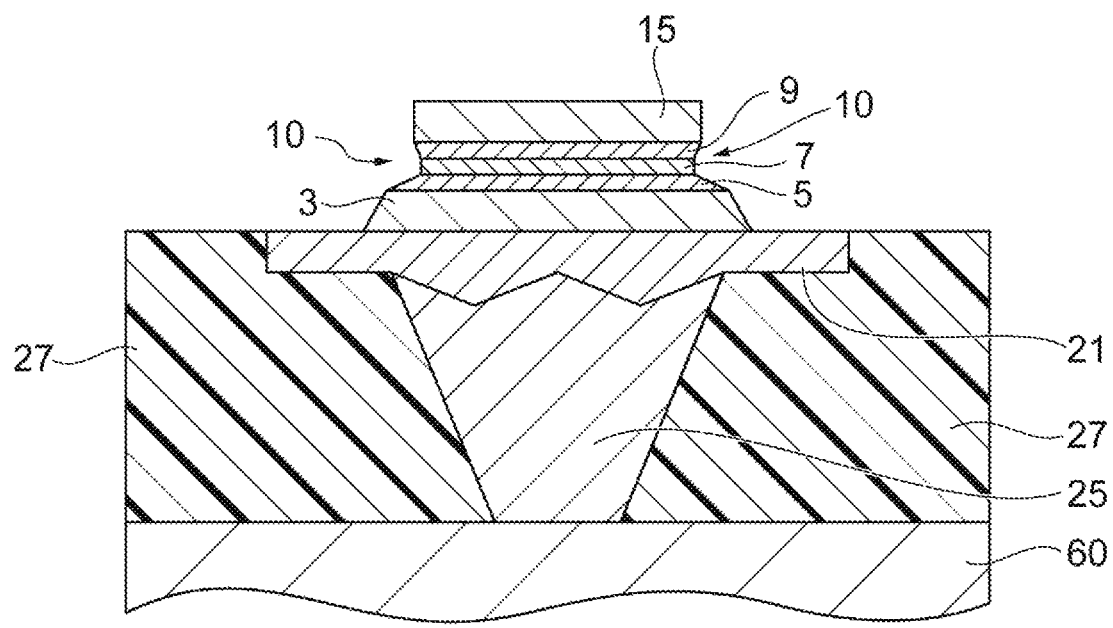
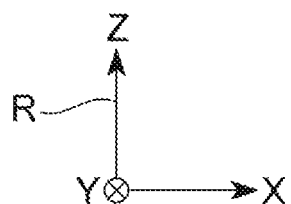

Fig.15
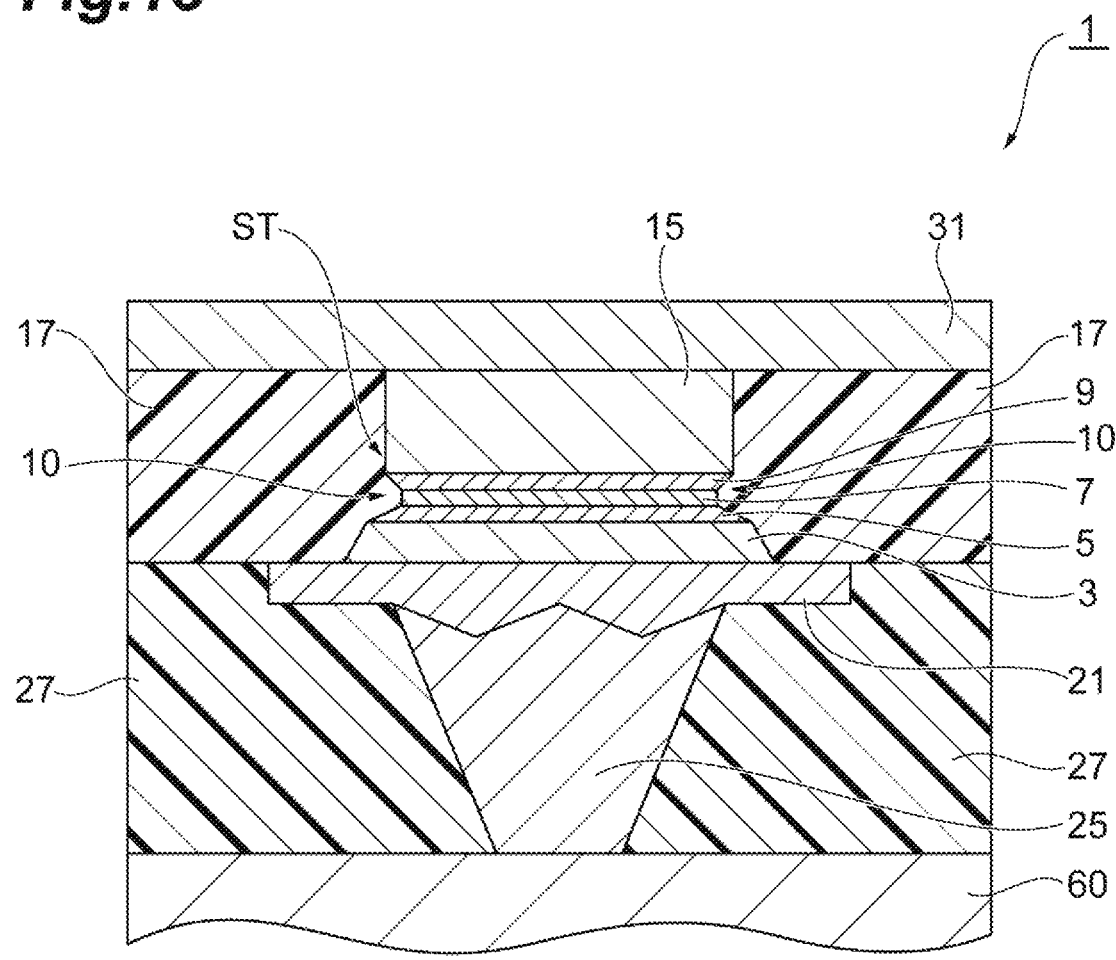
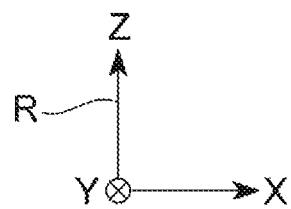

TUNNEL MAGNETORESISTIVE EFFECT ELEMENT, MAGNETIC MEMORY, AND BUILT-IN MEMORY

TECHNICAL FIELD

The present disclosure relates to a tunnel magnetoresistive effect element, a magnetic memory, and a built-in memory.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a non-magnetic spacer layer, and a magnetization free layer are stacked in this order are known. Among the magnetoresistive effect elements, the TMR element that uses an insulation layer (tunnel barrier layer) as the non-magnetic spacer layer generally has high element resistance but can realize a high magnetoresistive (MR) ratio, compared to the GMR element that uses a conductive layer as the non-magnetic spacer layer. Thus, the TMR element has drawn attention as an element used in a magnetic sensor, a magnetic head, a magnetoresistive random access memory (MRAM), and the like (for example, Patent Literatures 1 and 2 below).

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element. For example, applying this technology to the MRAM can reduce the size of a memory cell and thus can achieve high density for the reason that an interconnect for magnetic field generation for reversing the magnetization direction of the magnetization free layer is not necessary. Generally, the MRAM that uses the magnetization reversal technology based on the STT is called an "STT-MRAM".

The use of the TMR element that has perpendicular magnetic anisotropy is considered in order to further achieve high density in the MRAM or the like (for example, Patent Literatures 3 to 5 below). In such a TMR element, the magnetization direction of the reference layer is fixed in a perpendicular direction (the stack direction of the element; that is, a direction orthogonal to the in-plane direction of each layer), and the easy magnetization axis of the magnetization free layer is also in the perpendicular direction. Accordingly, since the amount of current needed for spin injection magnetization reversal can be reduced, the size of a selection transistor for selecting the TMR element can be reduced. Consequently, in the case of using the TMR element having perpendicular magnetic anisotropy, high density can be achieved since the size of the memory cell can be reduced compared to that in the case of using the TMR element that has in-plane magnetic anisotropy.

CITATION LIST

Patent Literature

[Patent Literature 1] Japanese Patent No. 5586028
[Patent Literature 2] Japanese Patent No. 5988019
[Patent Literature 3] U.S. Pat. No. 8,921,961
[Patent Literature 4] U.S. Pat. No. 8,860,156
[Patent Literature 5] U.S. Pat. No. 9,006,704

SUMMARY

In order to achieve a high density STT-MRAM, it is important to reduce the size of the selection transistor by reducing a reversal current needed for spin injection magnetization reversal after using the TMR element having perpendicular magnetic anisotropy (perpendicular magnetization type TMR element). In order to achieve the perpendicular magnetization TMR element, the easy magnetization axis of the magnetization free layer needs to be directed in the perpendicular direction. However, since the magnetization free layer has a layer shape, shape magnetic anisotropy acts to direct the easy magnetization axis of the magnetization free layer in the in-plane direction. Thus, magnetic anisotropy needs to be imparted to the magnetization free layer in the perpendicular direction using any method.

One of methods for inducing perpendicular magnetic anisotropy in the magnetization free layer is a method of inducing perpendicular magnetization in the magnetization free layer using interface magnetic anisotropy. In this method, perpendicular magnetization anisotropy is imparted to the magnetization free layer such that the direction of magnetization is directed in the perpendicular direction by setting the spin-orbit interaction in the interface between the magnetization free layer and the layer in contact with the magnetization free layer to be stronger than the shape magnetic anisotropy of the magnetization free layer. When the film thickness of the magnetization free layer is sufficiently decreased (for example, approximately 1 nm), the magnetization direction of the magnetization free layer that is in contact with the tunnel barrier layer can be directed in the perpendicular direction by forming the tunnel barrier layer of a material that imparts such interface magnetic anisotropy to the magnetization free layer. Furthermore, when a layer (perpendicular magnetization inducing layer) that imparts such interface magnetic anisotropy to the magnetization free layer is stacked on the surface of the magnetization free layer opposite to the surface of the magnetization free layer in contact with the tunnel barrier layer, the perpendicular magnetic anisotropy of the magnetization free layer is further increased. Consequently, even when the magnetization free layer is thicker (for example, approximately 2 nm), the magnetization direction of the magnetization free layer can be directed in the perpendicular direction. Such a perpendicular magnetization inducing layer can be formed of an oxide material such as MgO or $MgAl_2O_4$ (non-magnetic spinel material) and so on.

However, since the perpendicular magnetization inducing layer is formed of a material having high resistivity such as an oxide, the resistance of the TMR element is increased. Thus, the amount of spin-polarized current that flows through the magnetization free layer at the time of spin injection magnetization reversal is reduced. Consequently, since the magnetization reversal of the magnetization free layer does not easily occur, a problem arises in that the amount of current (reversal current) needed for causing magnetization reversal is increased. When the amount of reversal current is increased, a problem may arise in that the electric power consumption of a device in which the TMR element is used is increased, or the reliability of the device in which the TMR element is used is decreased.

The present disclosure is conceived in view of the above problems. An object of the present disclosure is to provide a TMR element in which the amount of reversal current is reduced. In addition, an object of the present disclosure is to provide a magnetic memory that includes the TMR element, and a built-in memory that includes the magnetic memory.

In order to resolve the above problems, a TMR element (tunnel magnetoresistive effect element) according to one aspect of the present disclosure includes a reference layer, a tunnel barrier layer, a perpendicular magnetization inducing layer, and a magnetization free layer that is stacked along a stack direction between the tunnel barrier layer and the perpendicular magnetization inducing layer. The perpendicular magnetization inducing layer imparts magnetic anisotropy along the stack direction to the magnetization free layer. The magnetization free layer has a width that is smaller than any of the width of the tunnel barrier layer or the width of the perpendicular magnetization inducing layer.

In the TMR element according to one aspect of the present disclosure, the magnetization free layer has a width that is smaller than any of a width of the tunnel barrier layer or a width of the perpendicular magnetization inducing layer. Thus, the current density of a spin-polarized current in the magnetization free layer is increased. Since the current density is increased, the magnetization of the magnetization free layer can be reversed using a small amount of spin-polarized current. The TMR element according to one embodiment of the present disclosure can reduce the amount of reversal current.

In the TMR element according to one aspect of the present disclosure, a minimum width of the magnetization free layer may be smaller than a maximum width of the tunnel barrier layer or a maximum width of the perpendicular magnetization inducing layer by 4 nm or greater. Accordingly, the current density of the spin-polarized current in the magnetization free layer is increased, and the amount of reversal current for reversing the magnetization direction of the magnetization free layer is reduced.

The TMR element according to one aspect of the present disclosure may further include a side wall portion that covers side surfaces of the tunnel barrier layer, the magnetization free layer, and the perpendicular magnetization inducing layer. The side wall portion may include an insulation material. Accordingly, the side wall portion that includes the insulation material covers the side surfaces of the tunnel barrier layer, the magnetization free layer, and the perpendicular magnetization inducing layer. A leak current between the tunnel barrier layer and the perpendicular magnetization inducing layer is suppressed.

In the TMR element according to one aspect of the present disclosure, the insulation material may include a nitride material. Accordingly, since the side wall portion is formed of the nitride material, for example, the movement of oxygen atoms included in the tunnel barrier layer and/or the perpendicular magnetization inducing layer to the side wall portion can be suppressed.

In the TMR element according to one aspect of the present disclosure, each of the tunnel barrier layer and the perpendicular magnetization inducing layer may be formed of MgO or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In). Accordingly, since these materials can particularly effectively impart magnetic anisotropy in the stack direction to the magnetization free layer, the direction of the easy magnetization axis of the magnetization free layer can be particularly stably set along a perpendicular direction.

Furthermore, in the TMR element according to one aspect of the present disclosure, the tunnel barrier layer and the perpendicular magnetization inducing layer may be formed of an oxide material that has a spinel structure represented by General Formula $AB_2O_4$, and at least one of an A site or a B site of the spinel structure may be occupied by a plurality of elements. Accordingly, a strain in the interface between the tunnel barrier layer and the magnetization free layer, and a strain in the interface between the perpendicular magnetization inducing layer and the magnetization free layer can be easily suppressed. Furthermore, the resistance value of each of the tunnel barrier layer and the perpendicular magnetization inducing layer can be easily controlled.

Furthermore, in the TMR element according to one aspect of the present disclosure, the tunnel barrier layer and the perpendicular magnetization inducing layer may be formed of an oxide material that has a spinel structure represented by General Formula $AB_2O_4$, and each of an A site and a B site of the spinel structure may be occupied by a plurality of elements. Accordingly, a strain in the interface between the tunnel barrier layer and the magnetization free layer, and a strain in the interface between the perpendicular magnetization inducing layer and the magnetization free layer can be more easily suppressed. Furthermore, the resistance value of each of the tunnel barrier layer and the perpendicular magnetization inducing layer can be more easily controlled.

The TMR element according to one aspect of the present disclosure may further include a mask layer that is disposed on the perpendicular magnetization inducing layer. The mask layer may have a width that is smaller than the width of the magnetization free layer, and include a heavy metal of atomic number 72 or greater. Accordingly, the mask layer has a width that is smaller than the width of the magnetization free layer. Thus, when the side wall portion is disposed, the shadow effect of the mask layer on the magnetization free layer is reduced, and the side wall portion is easily disposed outside the side surface of the magnetization free layer. In addition, since the mask layer includes the heavy metal of atomic number 72 or greater, the etching of the mask layer is suppressed.

A magnetic memory according to one aspect of the present disclosure includes any of the TMR elements as a storage element.

A built-in memory according to one aspect of the present disclosure includes the magnetic memory.

According to the present disclosure, a TMR element that reduces the amount of reversal current is provided. In addition, a magnetic memory that includes the TMR element, and a built-in memory that includes the magnetic memory are provided.

BRIEF DESCRIPTION OF DRAWINGS

FIG. 6 is a view illustrating a section for describing a specific example of a manufacturing method for the TMR element.

FIG. 7 is a view illustrating a section for describing the specific example of the manufacturing method for the TMR element.

FIG. 8 is a view illustrating a section for describing the specific example of the manufacturing method for the TMR element.

FIG. 9 is a view illustrating a section for describing the specific example of the manufacturing method for the TMR element.

FIG. 10 is a view illustrating a section for describing the specific example of the manufacturing method for the TMR element.

FIG. 13 is a view illustrating a section for describing the specific example of the manufacturing method for the TMR element.

FIG. 14 is a view illustrating a section for describing the specific example of the manufacturing method for the TMR element.

FIG. 15 is a view illustrating a section for describing the specific example of the manufacturing method for the TMR element.

DESCRIPTION OF EMBODIMENTS

Figure 1:
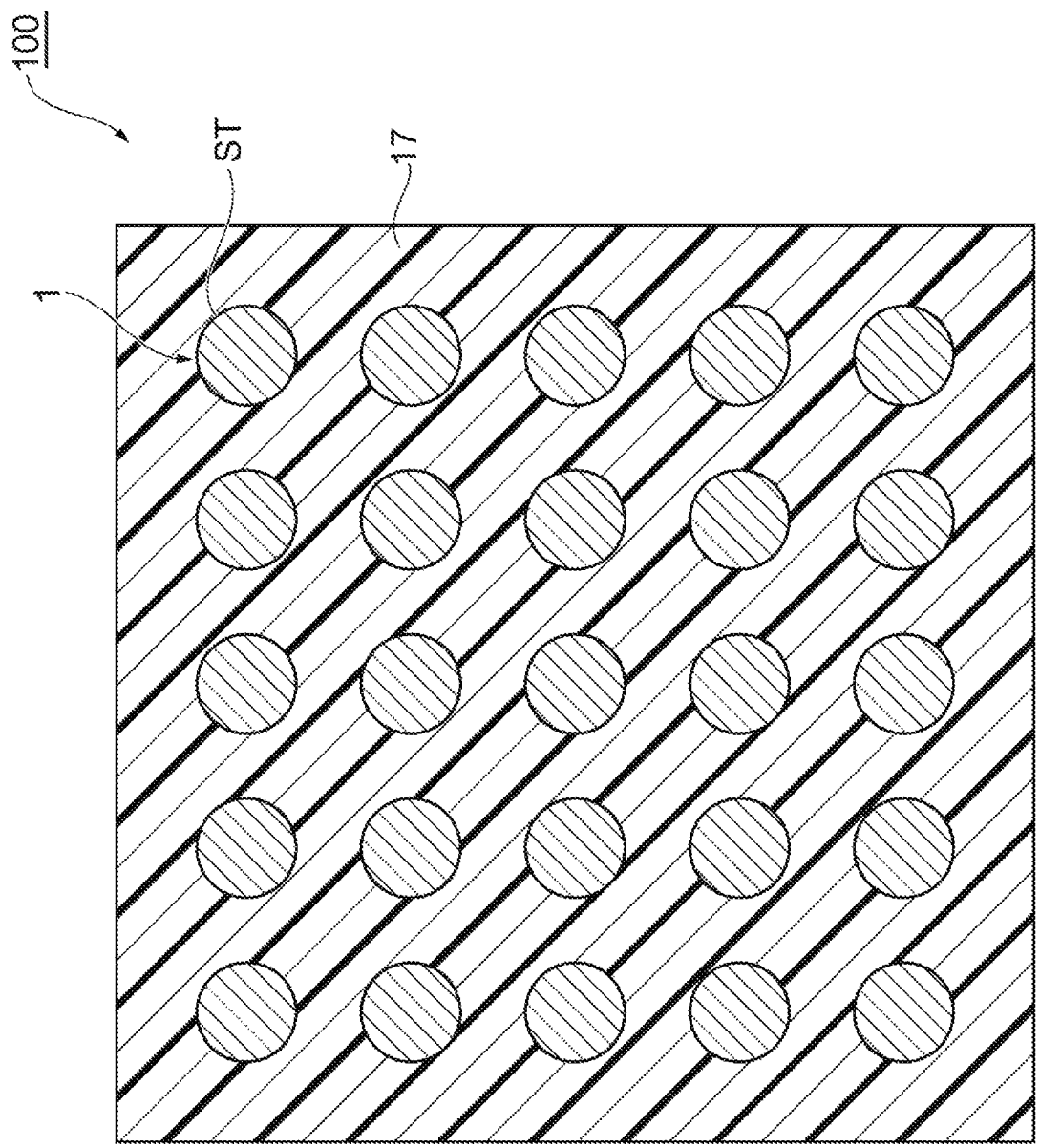
FIG. 1 is a cross-sectional plan view of an MRAM that includes a TMR element of an embodiment.

Hereinafter, an embodiment of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

Figure 2:
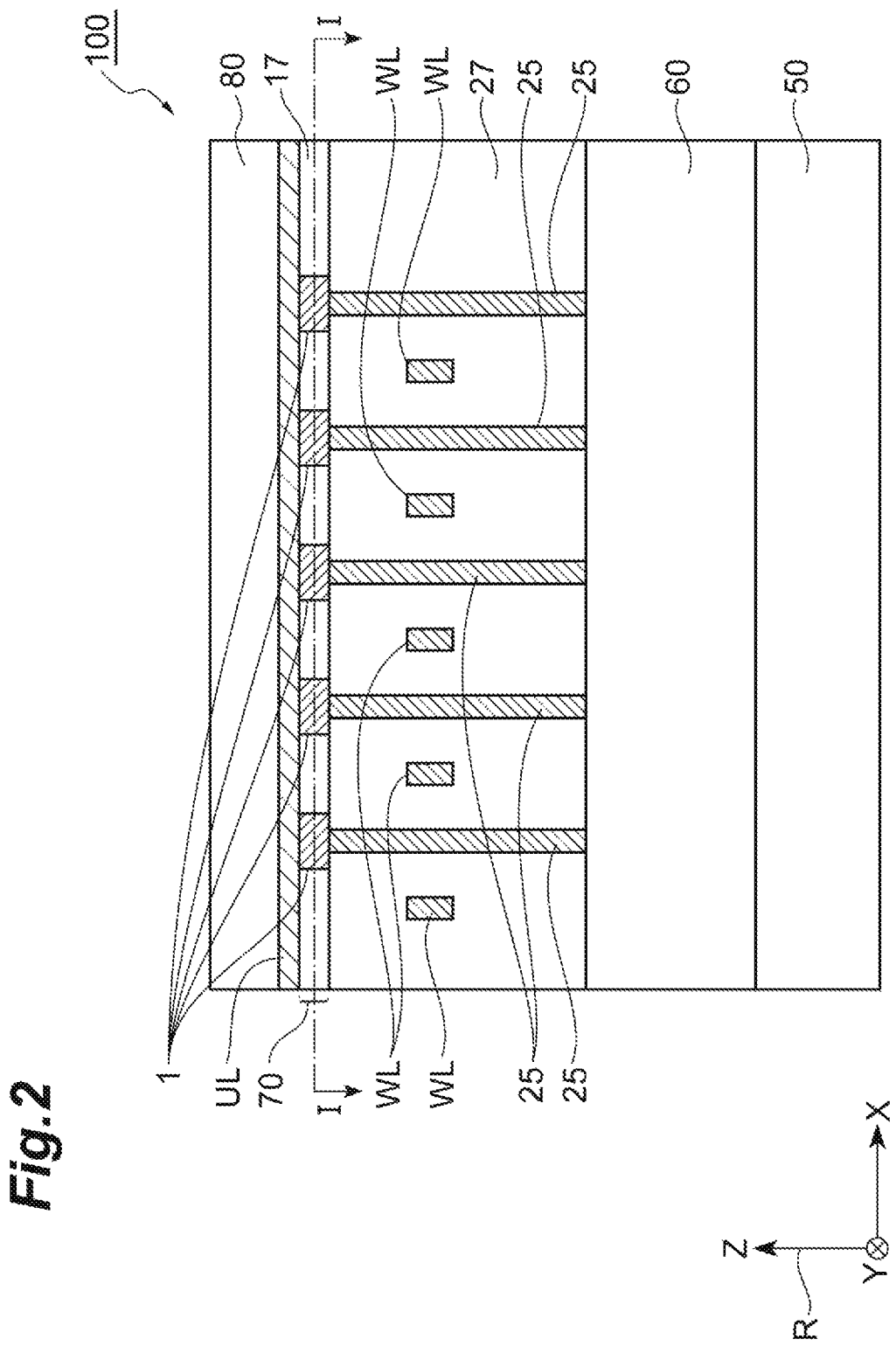
FIG. 2 is a schematic view of a vertical cross section of the MRAM according to the embodiment.

FIG. 1 is a cross-sectional plan view of a magnetic memory (magnetoresistive random access memory; MRAM) that includes a perpendicular magnetization TMR element (tunnel magnetoresistive effect element) according to the present embodiment. FIG. 2 is a schematic view of a vertical cross section of the MRAM according to the present embodiment. FIG. 1 corresponds to a cross section of an MRAM 100 taken along line I-I in FIG. 2. An orthogonal coordinate system R is illustrated in FIG. 1 and the subsequent drawings when necessary.

As illustrated in FIG. 1, the MRAM 100 of the present embodiment includes a plurality of TMR elements 1 that are arranged in an array form (five rows and five columns in FIG. 1) in an XY plane. Each of the plurality of TMR elements 1 functions as a storage element of the MRAM 100. As will be described in detail later, each TMR element 1 includes a stack portion ST and a side wall portion 17 in which the stack portion ST is embedded. As illustrated in FIG. 2, the MRAM 100 includes a semiconductor substrate 50, a transistor array 60, a via interconnect part 25, an interlayer insulation layer 27, a word line WL, a TMR element array 70 including the side wall portion 17, an upper interconnect UL, and an insulation body 80 that covers the upper surface of the upper interconnect UL. In FIG. 1 and FIG. 2, other electrical interconnects that connect the upper interconnect UL to the transistor array 60 are not illustrated except the word line WL.

The transistor array 60 is disposed on the principal surface of the semiconductor substrate 50 that extends along the XY plane. The MRAM 100 includes a plurality of transistors T (refer to FIG. 3) that are disposed in an array form in order to drive the plurality of TMR elements 1. A plurality of the via interconnect parts 25 and a plurality of the word lines WL are disposed on the transistor array 60. Each via interconnect part 25 electrically connects one of the plurality of transistors T of the transistor array 60 to the plurality of TMR elements 1 of the TMR element array 70. The plurality of via interconnect parts 25 and the plurality of word lines WL are embedded in the interlayer insulation layer 27 and are insulated from each other by the interlayer insulation layer 27.

Figure 3:
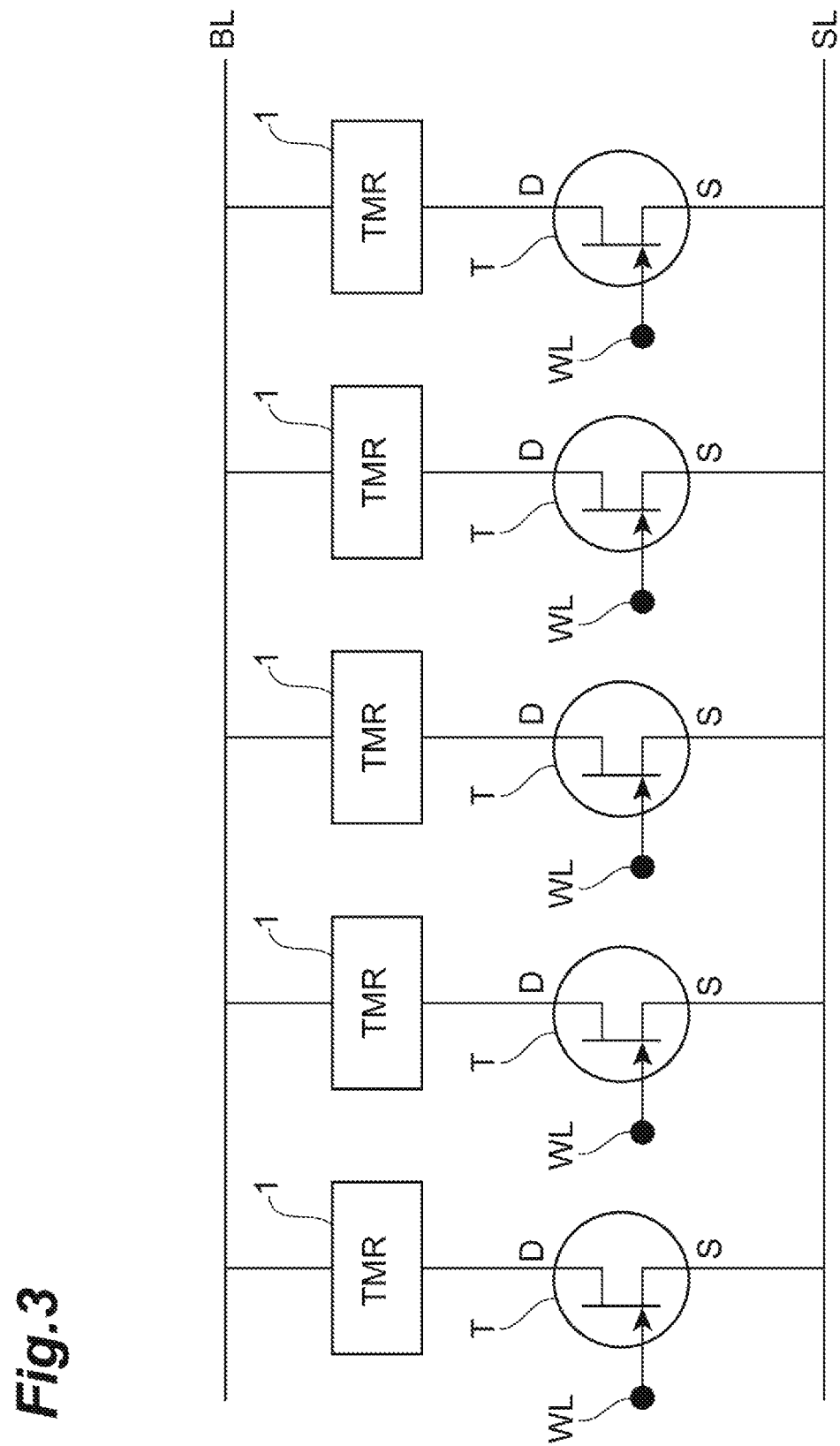
FIG. 3 is a view illustrating the electrical connection of the MRAM of the embodiment.

FIG. 3 is a view illustrating the electrical connection of the MRAM of the present embodiment. In FIG. 3, only electrical connection related to five TMR elements 1 of the plurality of TMR elements 1 of the TMR element array 70 is illustrated.

As illustrated in FIG. 3, one end of each TMR element 1 is electrically connected to a drain D of each transistor T, respectively. The other end of each TMR element 1 is electrically connected to a bit line BL. The bit line BL is included in the upper interconnect UL (refer to FIG. 2). The gate of each transistor T is electrically connected to each word line WL respectively, and a source S of each transistor T is electrically connected to a source line SL. Each transistor T functions as the storage element of the MRAM 100. One transistor T and one transistor T electrically connected thereto constitute one memory cell.

When data is written into the memory cell of the MRAM 100, a selection voltage is applied to the word line WL that corresponds to the TMR element 1 of a write target. Then, in a state where this TMR element 1 is set to ON state, a voltage is applied between the bit line BL and the source line SL such that a current of which the polarity corresponds to the write data ("1" or "0") flows through the TMR element 1. The magnitude of the voltage applied at this point is set to a magnitude that may cause spin injection magnetization reversal in a magnetization free layer 7 (refer to FIG. 4) of the TMR element 1 as will be described later. Accordingly, the magnetization direction of the magnetization free layer 7 (refer to FIG. 4) of the TMR element 1 is set to a direction corresponding to the write data.

When data is read from the memory cells of the MRAM 100, a selection voltage is applied to the word line WL that corresponds to the TMR element 1 of a read target. Then, in a state where this TMR element 1 is set to ON state, a voltage that is smaller than the voltage at the time of writing is applied between the bit line BL and the source line SL. Accordingly, since a current of which the magnitude corresponds to data stored in the TMR element 1 flows between the bit line BL and the source line SL through the TMR element 1, the data is read by detecting the current value.

Figure 4:
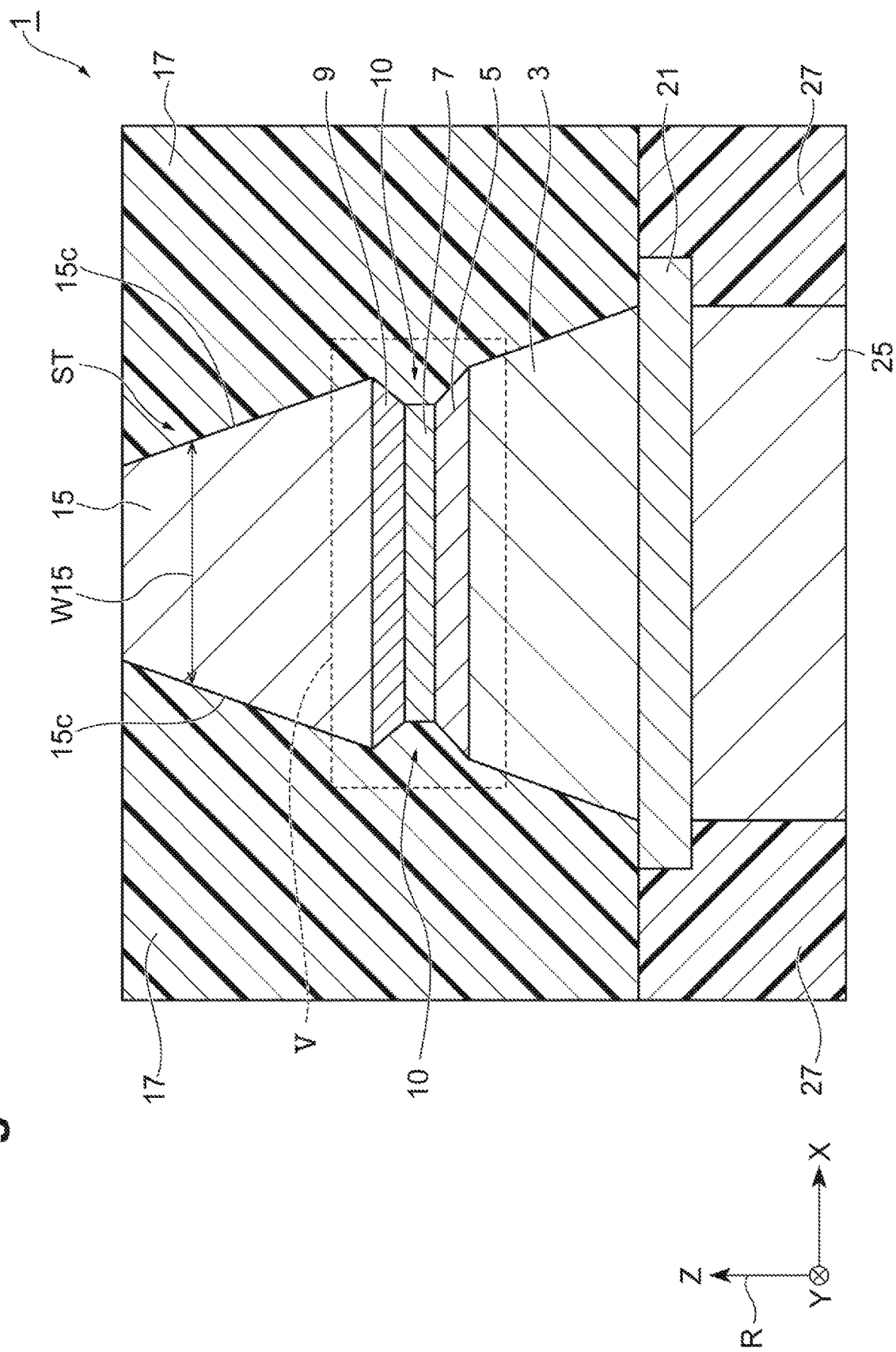
FIG. 4 is a cross-sectional view in the vicinity of the TMR element of the MRAM of the embodiment.
Figure 5:
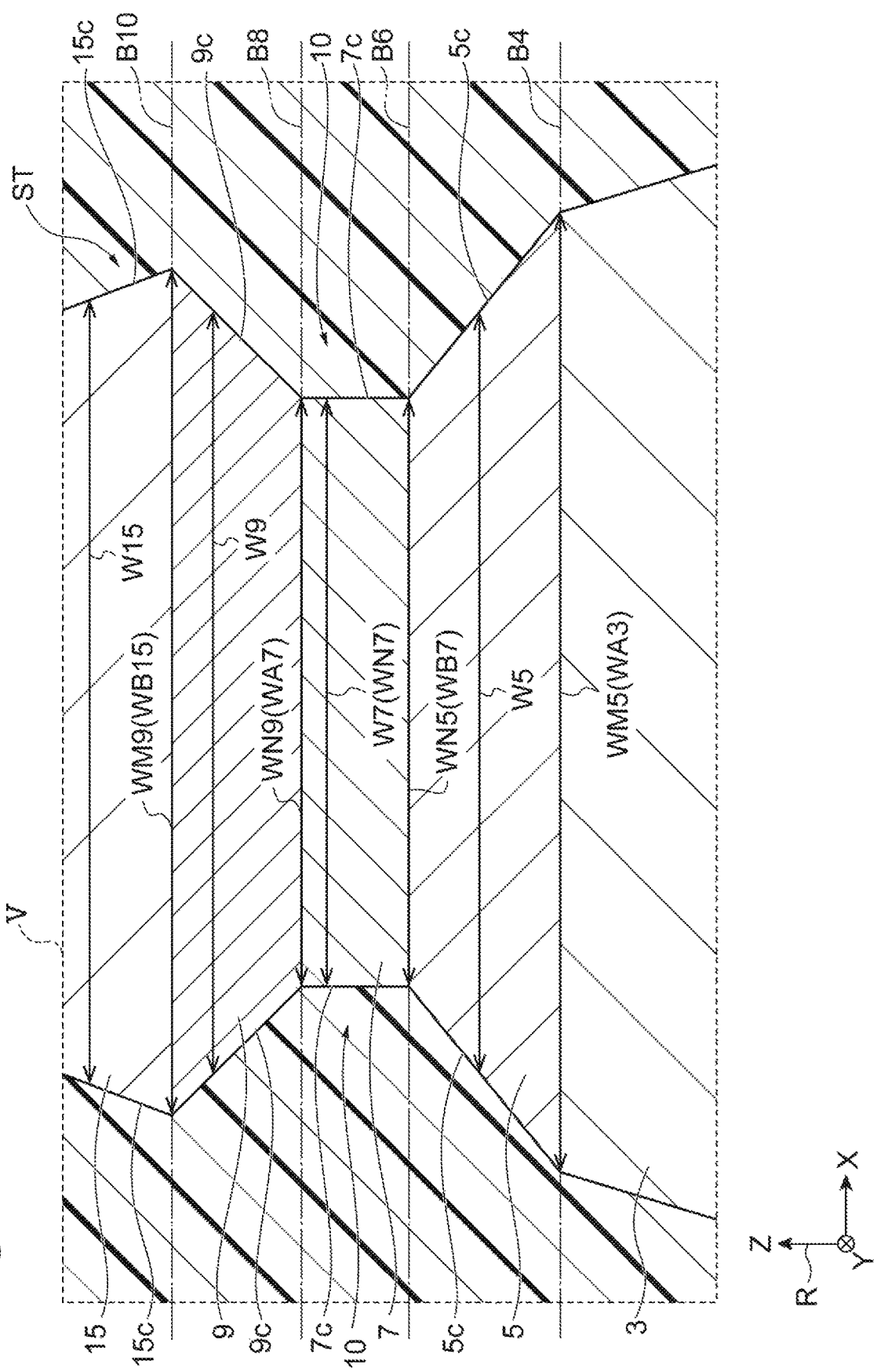
FIG. 5 is an enlarged view of a region V in FIG. 4.

Next, a detailed configuration of each TMR element 1 of the present embodiment will be described. FIG. 4 is a cross-sectional view in the vicinity of the TMR element of the MRAM of the present embodiment. FIG. 4 illustrates a cross-section in the vicinity of one TMR element 1 in the vertical cross-section of the MRAM 100 illustrated in FIG. 2. FIG. 5 is an enlarged view of a region V in FIG. 4.

As illustrated in FIG. 4 and FIG. 5, the stack portion ST of the TMR element 1 is disposed on a base layer 21 that is disposed on the via interconnect part 25. The via interconnect part 25 is formed of a conductive material. The via interconnect part 25 is formed of, for example, a metal such as Cu. The base layer 21 is formed of a conductive material. The base layer 21 is formed of, for example, a conductive oxide, a conductive nitride, a conductive oxynitride, or a silicide. Thus, the lower surface of a reference layer 3 that is one end of the TMR element 1 of the present embodiment is electrically connected to the drain D (refer to FIG. 3) of the transistor T through the base layer 21 and the via interconnect part 25.

The base layer 21 is disposed in order to improve the flatness of each layer of the stack portion ST, particularly, a tunnel barrier layer described later. Thus, the flatness of the upper surface of the base layer 21 is set to be higher than the flatness of the upper surface of the via interconnect part 25. The upper surface of the base layer 21 has high flatness and extends along the XY plane. The stack portion ST is formed on the upper surface of the base layer 21. The via interconnect part 25 and the base layer 21 are embedded in the interlayer insulation layer 27 and, by the interlayer insulation layer 27, are electrically insulated from the via interconnect parts and the base layers that are electrically connected to the other TMR elements 1.

The TMR element 1 includes the stack portion ST and the side wall portion 17 that is formed of an insulation material which covers the side surface of each layer of the stack portion ST. The stack portion ST is configured with a plurality of layers that are stacked along a Z-axis direction which is a stack direction. Specifically, the stack portion ST is configured by stacking the reference layer 3, a tunnel barrier layer 5, the magnetization free layer 7, a perpendicular magnetization inducing layer 9, and a mask layer 15 in this order. The reference layer 3 functions as a magnetization fixed layer. Thus, the tunnel barrier layer 5 is stacked in the Z-axis direction between the reference layer 3 and the magnetization free layer 7. The perpendicular magnetization inducing layer 9 is stacked on the side of the magnetization free layer 7 opposite to the tunnel barrier layer 5 side.

The stack portion ST includes a recess 10 outside the tunnel barrier layer 5, the magnetization free layer 7, and the perpendicular magnetization inducing layer 9. In the stack portion ST, for example, a side surface 5c of the tunnel barrier layer 5 can have an inclination such that a width W5 of the tunnel barrier layer 5 is monotonously decreased in a direction from a boundary B4 between the reference layer 3 and the tunnel barrier layer 5 toward a boundary B6 between the tunnel barrier layer 5 and the magnetization free layer 7. For example, the tunnel barrier layer 5 can have the width W5 of any magnitude within a range of a maximum width WM5 at the boundary B4 to a minimum width WN5 at the boundary B6. The maximum width WM5 of the tunnel barrier layer 5 can match or approximate to a width WA3 of the reference layer 3 at the boundary B4. The minimum width WN5 of the tunnel barrier layer 5 can match or approximate to a width WB7 of the magnetization free layer 7 at the boundary B6. The magnetization free layer 7 has a width W7 that is smaller than the width W5 of the tunnel barrier layer 5.

In addition, in the stack portion ST, for example, a side surface 9c of the perpendicular magnetization inducing layer 9 can have an inclination such that a width W9 of the perpendicular magnetization inducing layer 9 is monotonously decreased in a direction from a boundary B10 between the mask layer 15 and the perpendicular magnetization inducing layer 9 toward a boundary B8 between the perpendicular magnetization inducing layer 9 and the magnetization free layer 7. For example, the perpendicular magnetization inducing layer 9 can have the width W9 of any magnitude within a range of a maximum width WM9 at the boundary B10 to a minimum width WN9 at the boundary B8. The maximum width WM9 of the perpendicular magnetization inducing layer 9 can match or approximate to a width WB15 of the mask layer 15 at the boundary B10. The minimum width WN9 of the perpendicular magnetization inducing layer 9 can match or approximate to the width W7 of the magnetization free layer 7 at the boundary B6. The magnetization free layer 7 has the width W7 that is smaller than the width W9 of the perpendicular magnetization inducing layer 9.

In the TMR element 1, the magnetization free layer 7 has a width that is smaller than any of the width W5 of the tunnel barrier layer 5 or the width W9 of the perpendicular magnetization inducing layer 9. Thus, the current density of a spin-polarized current in the magnetization free layer 7 is increased. Since the current density is increased, the magnetization of the magnetization free layer 7 can be reversed using a small amount of spin-polarized current. The TMR element 1 can reduce the amount of reversal current.

In the present embodiment, the width W7 of the magnetization free layer 7 can be smaller than a width WB3 of the reference layer 3 or the width WB15 of the mask layer 15 by 4 nm or greater. Thus, a minimum width WN7 of the magnetization free layer 7 can be smaller than the maximum width WM9 of the perpendicular magnetization inducing layer 9 or the maximum width WM5 of the tunnel barrier layer 5 by 4 nm or greater. Accordingly, the current density of the spin-polarized current in the magnetization free layer 7 is increased, and the amount of reversal current for reversing the magnetization direction of the magnetization free layer 7 is reduced.

In the tunnel barrier layer 5 and the perpendicular magnetization inducing layer 9, while each of the side surface 5c and the side surface 9c can have a linear inclination such that the width W5 of the tunnel barrier layer 5 and the width W9 of the perpendicular magnetization inducing layer 9 are monotonously changed, each of the side surface 5c and the side surface 9c may have an inclination other than such a linear inclination. For example, each of the side surface 5c and the side surface 9c may have a curved inclination, or may have a protrusion or a recess thereon.

The reference layer 3 is formed of a ferromagnetic material such as Co, a Co—Fe alloy, or a Co—Fe—B alloy. The magnetization direction of the reference layer 3 is substantially fixed in the Z-axis direction. The thickness in the Z-axis direction of the reference layer 3 can be, for example, greater than or equal to 3 nm and less than or equal to 10 nm. The reference layer 3 can have a structure in which a multilayer film such as Co/Pt or Co/Ni is repeatedly stacked such that the magnetization direction of each magnetic layer is in a perpendicular direction.

The reference layer 3 can have a structure in which magnetic fields that occur in the reference layer 3 offset each other using the RKKY interaction that occurs through a thin film of Ru, Ir, or the like. This structure is a synthetic anti-ferromagnet (SAF) structure, that is, a structure that includes two ferromagnetic layers formed of a ferromagnetic material and a non-magnetic layer stacked between the two ferromagnetic layers in which the magnetization directions of the two ferromagnetic layers are coupled to each other through the non-magnetic layer in antiparallel by exchange coupling that is based on the RKKY interaction.

The tunnel barrier layer 5 is formed of an insulation material. The tunnel barrier layer 5 is preferably configured to induce perpendicular magnetic anisotropy in the magnetization free layer 7 based on the same principle as the perpendicular magnetization inducing layer 9 described later. The reason is that the perpendicular magnetization of the magnetization free layer 7 is more stable, and the film thickness of the magnetization free layer 7 can be increased. The material constituting the tunnel barrier layer 5 that may induce perpendicular magnetic anisotropy in the magnetization free layer 7 can be exemplified by, for example, MgO, ZnO, $GaO_x$, or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In).

The tunnel barrier layer 5 may be configured not to induce perpendicular magnetic anisotropy in the magnetization free layer 7. In this case, the tunnel barrier layer 5 can be formed of a non-magnetic metal material such as Cu or Ag, or a semiconductor material such as Si or Ge.

The thickness in the Z-axis direction of the tunnel barrier layer 5 is small such that a tunnel current flows through the tunnel barrier layer 5 in the Z-axis direction when a voltage is applied between the reference layer 3 and the magnetization free layer 7. The thickness in the Z-axis direction of the tunnel barrier layer 5 can be, for example, greater than or equal to 1 nm and less than or equal to 3 nm.

In addition, in the present embodiment, the tunnel barrier layer 5 is foamed of a material that induces magnetic anisotropy (perpendicular magnetic anisotropy) in the Z-axis direction in a region of the magnetization free layer 7 in the vicinity of the interface between the magnetization free layer 7 and the tunnel barrier layer 5. Accordingly, the tunnel barrier layer 5 imparts magnetic anisotropy in a direction (perpendicular direction) along the Z axis to the magnetization free layer 7 in cooperation with the perpendicular magnetization inducing layer 9 described later. When the easy magnetization axis of the magnetization free layer 7 can be sufficiently stably directed in the direction along the Z axis by the action and the like of the perpendicular magnetization inducing layer 9, the tunnel barrier layer 5 may be formed of a material that does not induce perpendicular magnetic anisotropy in the magnetization free layer 7.

The magnetization free layer 7 is formed of a ferromagnetic material such as Fe, Co—Fe, Co—Fe—B, or a ferromagnetic Heusler alloy. The magnetization direction of the magnetization free layer 7 is substantially not fixed.

The perpendicular magnetization inducing layer 9 is formed of, for example, MgO, ZnO, $Ga_2O_3$, or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In).

The perpendicular magnetization inducing layer 9 is preferably configured such that the resistance value of the perpendicular magnetization inducing layer 9 along the Z-axis direction per unit area in the XY plane is smaller than that of the tunnel barrier layer 5. Particularly, when the perpendicular magnetization inducing layer 9 is formed of an insulation material, the thickness in the Z-axis direction of the perpendicular magnetization inducing layer 9 is preferably smaller than the thickness in the Z-axis direction of the tunnel barrier layer 5.

The perpendicular magnetization inducing layer 9 is formed of a material that induces magnetic anisotropy (perpendicular magnetic anisotropy) in the direction along the Z axis in a region of the magnetization free layer 7 in the vicinity of the interface between the magnetization free layer 7 and the perpendicular magnetization inducing layer 9 based on the spin-orbit interaction. Accordingly, the perpendicular magnetization inducing layer 9 imparts magnetic anisotropy in the direction (perpendicular direction) along the Z axis to the magnetization free layer 7 in cooperation with the tunnel barrier layer 5.

The thickness in the Z-axis direction of the magnetization free layer 7 is small such that the easy magnetization axis of the magnetization free layer 7 is stably set along the direction along the Z axis by the function of imparting magnetic anisotropy exhibited by the tunnel barrier layer 5 and the perpendicular magnetization inducing layer 9 as described above. The thickness can be, for example, greater than or equal to 1 nm and less than or equal to 3 nm.

The TMR element 1 can further include the mask layer 15 that is disposed on the perpendicular magnetization inducing layer 9. A side surface 15c of the mask layer 15 can have an inclination such that a width W15 of the mask layer 15 is decreased in a direction away from the perpendicular magnetization inducing layer 9 in the stack direction. At the boundary B10 between the mask layer 15 and the perpendicular magnetization inducing layer 9, the mask layer 15 has the width W15 that matches or approximates to the maximum width WM9 of the perpendicular magnetization inducing layer 9. The width W15 can be gradually decreased. Accordingly, the mask layer 15 has the width W15 that is smaller than the width W7 of the magnetization free layer 7. When the side wall portion 17 is disposed, the shadow effect of the mask layer 15 on the magnetization free layer 7 is reduced, and the side wall portion 17 is easily disposed outside a side surface 7c of the magnetization free layer 7. The side wall portion 17 is also easily disposed in the recess 10.

The mask layer 15 is formed of a conductive material. For example, the mask layer 15 is formed of a metal such as Ta, Ru, W, TaN, TiN, or CuN. The upper surface of the mask layer 15, which is the other end of the TMR element 1 of the present embodiment, is electrically connected to the bit line BL (refer to FIG. 3). The mask layer 15 can include a heavy metal of atomic number 72 or greater (a heavy metal such as W or Ta). Since the mask layer 15 includes a heavy metal of atomic number 72 or greater, the etching of the mask layer is suppressed. The TMR element 1 having the above configuration can be easily manufactured using a manufacturing method that includes an etching step using the mask layer 15.

The side wall portion 17 can cover the side surface of each of the tunnel barrier layer 5, the magnetization free layer 7, and the perpendicular magnetization inducing layer 9. Accordingly, the side wall portion 17 electrically insulates the tunnel barrier layer 5, the magnetization free layer 7, and the perpendicular magnetization inducing layer 9 of the TMR element 1 from the tunnel barrier layers, the magnetization free layers, and the perpendicular magnetization inducing layers of the other TMR elements. The side wall portion 17 may cover the whole side surface of the stack portion ST, that is, the side surface of each of the reference layer 3, the tunnel barrier layer 5, the magnetization free layer 7, the perpendicular magnetization inducing layer 9, and the mask layer 15. In this case, the side wall portion 17 electrically insulates the stack portion ST of the TMR element 1 from the stack portions of the other TMR elements. The side wall portion 17 may be in contact with the side surfaces of all of the reference layer 3, the tunnel barrier layer 5, the magnetization free layer 7, the perpendicular magnetization inducing layer 9, and the mask layer 15, or may not be in contact with a part of the side surfaces thereof. The side wall portion 17 is formed of an insulation material. The side wall portion 17 is formed of, for example, a nitride material such as SiN, or an oxynitride material such as SiON.

As described above, since the easy magnetization axis of the magnetization free layer 7 is set along the direction along the Z axis, and the magnetization direction of the reference layer 3 is substantially fixed in the Z-axis direction, the magnetization direction of the reference layer 3 is parallel or antiparallel to the magnetization direction of the magnetization free layer 7 when the magnetization free layer 7 is not substantially affected by an external magnetic field or an STT. The stack portion ST in a state where the magnetization directions of the reference layer 3 and the magnetization free layer 7 are parallel to each other has a different electrical resistance value in the Z-axis direction from that of the stack portion ST in a state where the magnetization directions of the reference layer 3 and the magnetization free layer 7 are antiparallel to each other. Thus, these two states respectively correspond to "1" and "0" that are data of the memory cell of the MRAM 100.

The magnetization direction of the magnetization free layer 7 is reversed (that is, data is written into the memory cell in the MRAM 100) by spin injection magnetization reversal. Specifically, when the magnetization direction of the magnetization free layer 7 is reversed to a parallel state from an antiparallel state with respect to the magnetization direction of the reference layer 3, a voltage is applied between one end and the other end in the Z-axis direction of the stack portion ST such that the tunnel current flows through the tunnel barrier layer 5 in a direction from the magnetization free layer 7 toward the reference layer 3 (that is, spin-polarized electrons move toward the magnetization free layer 7 from the reference layer 3). Accordingly, from the spin-polarized electrons, the magnetization free layer 7 receives a spin transfer torque in a direction in which the magnetization direction of the magnetization free layer 7 rotates toward a parallel state from an antiparallel state with respect to the magnetization direction of the reference layer 3. The magnetization direction of the magnetization free layer 7 is reversed by setting the magnitude of the voltage to be higher than or equal to a threshold that causes spin injection magnetization reversal.

Conversely, when the magnetization direction of the magnetization free layer 7 is reversed to an antiparallel state from a parallel state with respect to the magnetization direction of the reference layer 3, a voltage is applied between one end and the other end in the Z-axis direction of the stack portion ST such that the tunnel current flows through the tunnel barrier layer 5 in a direction from the reference layer 3 toward the magnetization free layer 7 (that is, spin-polarized electrons move toward the reference layer 3 from the magnetization free layer 7). Accordingly, from the spin-polarized electrons, the magnetization free layer 7 receives a spin transfer torque in a direction in which the magnetization direction of the magnetization free layer 7 rotates toward an antiparallel state from a parallel state with respect to the magnetization direction of the reference layer 3. The magnetization direction of the magnetization free layer 7 is reversed by setting the magnitude of the voltage to be higher than or equal to the threshold that causes spin injection magnetization reversal.

In the TMR element 1 according to the present embodiment, at least one of the tunnel barrier layer 5 or the perpendicular magnetization inducing layer 9 is preferably formed of an oxide material, and the side wall portion 17 is preferably formed of a nitride material. Accordingly, since the side wall portion 17 is formed of a nitride material, the movement of the oxygen atoms of the tunnel barrier layer 5 and/or the perpendicular magnetization inducing layer 9 formed of an oxide material to the side wall portion 17 can be suppressed.

In the TMR element 1 according to the present embodiment, each of the tunnel barrier layer 5 and the perpendicular magnetization inducing layer 9 is preferably formed of MgO or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In). Accordingly, since these materials can particularly effectively impart magnetic anisotropy to the magnetization free layer 7 in the Z-axis direction, the direction of the easy magnetization axis of the magnetization free layer 7 can be particularly stably set along the perpendicular direction.

In the TMR element 1 according to the present embodiment, each of the tunnel barrier layer 5 and the perpendicular magnetization inducing layer 9 is preferably formed of an oxide material that has a spinel structure represented by above General Formula $AB_2O_4$. At least one of the A site or the B site of the spinel structure is preferably occupied by a plurality of elements. Each of the A site and the B site of the spinel structure is preferably occupied by a plurality of elements. Accordingly, a strain in the interface between the tunnel barrier layer 5 and the magnetization free layer 7, and a strain in the interface between the perpendicular magnetization inducing layer 9 and the magnetization free layer 7 can be easily suppressed. Furthermore, the resistance value of each of the tunnel barrier layer 5 and the perpendicular magnetization inducing layer 9 can be easily controlled.

A specific example of a manufacturing method for such a TMR element of the present embodiment will be described. FIG. 6 to FIG. 15 are views illustrating a section for describing the specific example of the manufacturing method for the TMR element of the present embodiment. Each of FIG. 6 to FIG. 15 corresponds to the above section in the vicinity of the TMR element 1 illustrated in FIG. 4.

In the specific example of the manufacturing method, first, as illustrated in FIG. 6, a lower interlayer insulation layer 27a is formed on the whole surface on the transistor array 60. Then, a resist 41 that has an opening is formed on the lower interlayer insulation layer 27a. The lower interlayer insulation layer 27a is formed of the same material as the interlayer insulation layer 27. The opening of the resist 41 corresponds to a region in which the via interconnect part 25 described later is formed.

Next, as illustrated in FIG. 7, the lower interlayer insulation layer 27a is etched by dry etching such as reactive ion etching (RIE) using the resist 41 as a mask. Then, an opening that has a depth reaching the transistor array 60 is formed in the lower interlayer insulation layer 27a by removing the resist 41.

Next, as illustrated in FIG. 8, the via interconnect part 25 that is formed of a metal such as Cu is formed such that the opening of the lower interlayer insulation layer 27a is embedded. Then, the base layer 21 that is formed of a conductive material is formed on the via interconnect part 25 and the lower interlayer insulation layer 27a. A base layer that is formed of a conductive material such as Ta may be foamed on the side surface of the opening of the lower interlayer insulation layer 27a before the via interconnect part 25 is formed.

Next, as illustrated in FIG. 9, a resist 43 is formed on the base layer 21. The resist 43 is formed at a position that is above the whole via interconnect part 25 and a part of the lower interlayer insulation layer 27a in the perpendicular direction, and is not formed at a position that is above, in the perpendicular direction, a region in which an upper interlayer insulation layer 27b described later is formed.

Next, as illustrated in FIG. 10, the base layer 21 is selectively etched by dry etching such as RIE using the resist 43 as a mask. The upper interlayer insulation layer 27b is formed in the etched region. Then, the resist 43 is removed. Then, the surface of each of the base layer 21 and the upper interlayer insulation layer 27b is flattened by polishing such as chemical mechanical polishing (CMP). Accordingly, the flatness of the upper surface of the base layer 21 is higher than the flatness of the upper surface of the via interconnect part 25. The upper interlayer insulation layer 27b is formed of the same material as the interlayer insulation layer 27. The lower interlayer insulation layer 27a and the upper interlayer insulation layer 27b constitute the interlayer insulation layer 27.

Figure 11:
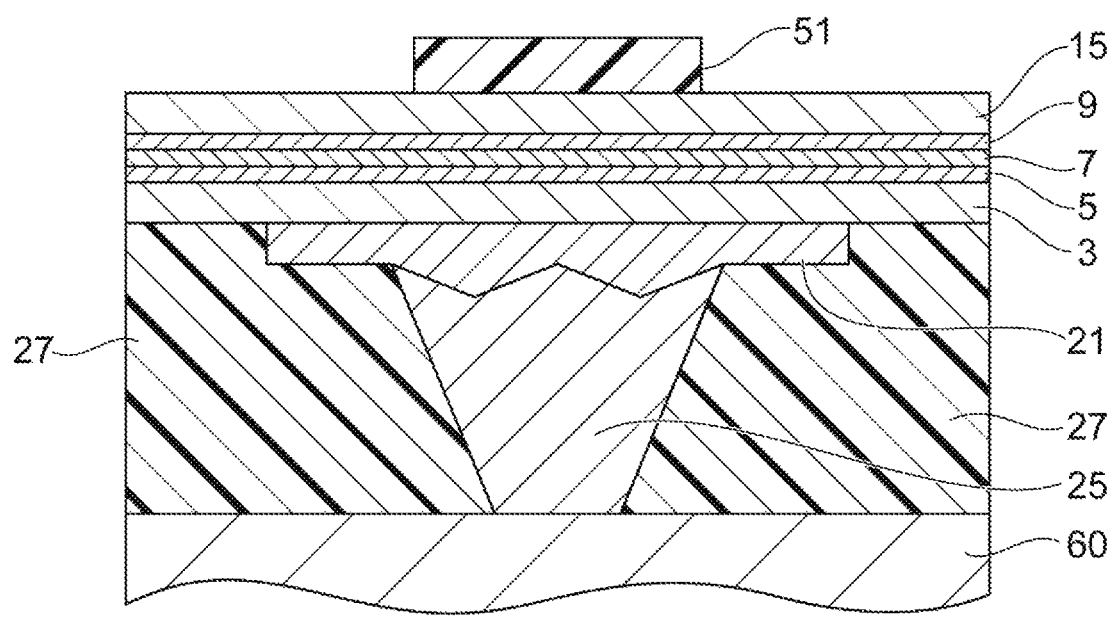
FIG. 11 is a view illustrating a section for describing the specific example of the manufacturing method for the TMR element.

Next, as illustrated in FIG. 11, the reference layer 3, the tunnel barrier layer 5, the magnetization free layer 7, the perpendicular magnetization inducing layer 9, and the mask layer 15 are formed in this order on the whole surface on the base layer 21 and the interlayer insulation layer 27. Then, a resist 51 is formed on a part of the surface of the mask layer 15. The resist 51 is formed at a position that is above the via interconnect part 25 in the perpendicular direction and above a part of the base layer 21 in the perpendicular direction. When necessary, a seed layer that is formed of a conductive material such as Ta and covers the whole surface on the base layer 21 and the interlayer insulation layer 27 may be formed between the base layer 21 and the interlayer insulation layer 27, and the reference layer 3.

Figure 12:
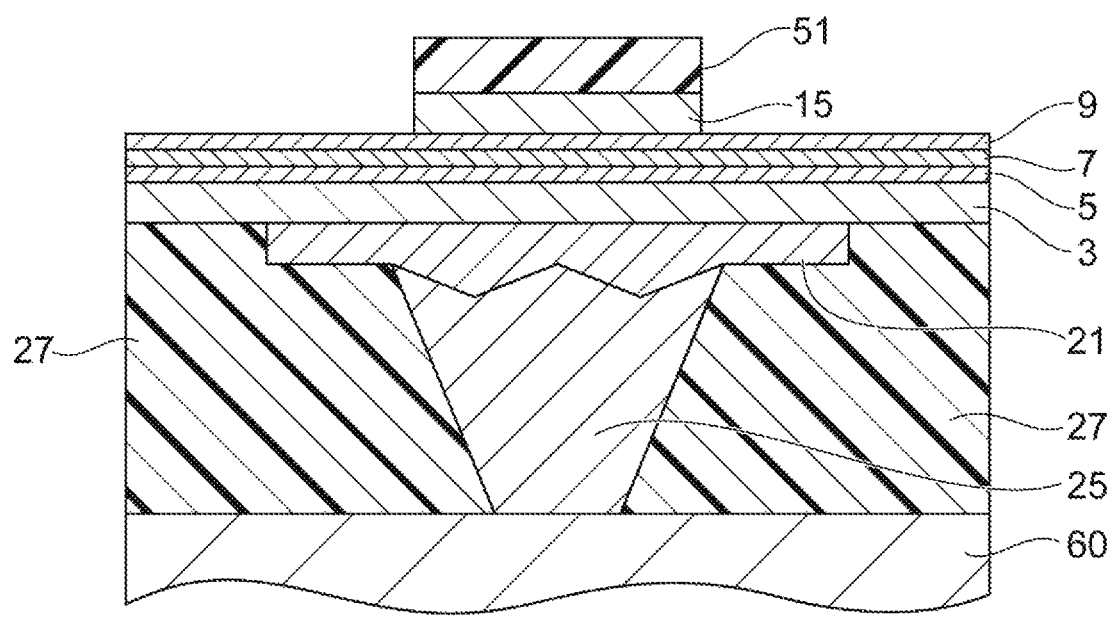
FIG. 12 is a view illustrating a section for describing the specific example of the manufacturing method for the TMR element.

Next, as illustrated in FIG. 12, the mask layer 15 is selectively etched by dry etching such as RIE using the resist 51 as a mask, and the surface of the perpendicular magnetization inducing layer 9 is exposed.

Next, as illustrated in FIG. 13, the resist 51 is removed. Then, the perpendicular magnetization inducing layer 9, the magnetization free layer 7, the tunnel barrier layer 5, and the reference layer 3 are etched by dry etching such as RIE using the mask layer 15 as a mask. The etching is stopped when the base layer 21 and the interlayer insulation layer 27 are exposed.

Next, as illustrated in FIG. 14, the side surface of the magnetization free layer 7 is etched by dry etching such as ion beam etching (IBE). In the IBE, the side surface of the magnetization free layer 7 is irradiated with an ion beam of a noble gas such as argon, krypton, or xenon. For example, the irradiation direction of the ion beam has an angle of 10 to 25 degrees with respect to the in-plane direction of the magnetization free layer 7. In the present embodiment, while the side surface of the magnetization free layer 7 is irradiated with the ion beam, the width of the ion beam is greater than the thickness of the magnetization free layer 7. Thus, the side surface of each of the perpendicular magnetization inducing layer 9 and the tunnel barrier layer 5 is also etched. Consequently, the width of each of the perpendicular magnetization inducing layer 9 and the tunnel barrier layer 5 can be decreased in a direction approaching to the magnetization free layer 7. The hardness of the magnetization free layer 7 is, for example, lower than the hardness of each of the perpendicular magnetization inducing layer 9 and the tunnel barrier layer 5. Since the mask layer 15 includes a heavy metal of atomic number 72 or greater, the etching of the mask layer 15 is suppressed.

Next, as illustrated in FIG. 15, the side wall portion 17 is faulted on the base layer 21 and the interlayer insulation layer 27 such that the stack portion ST is embedded. The mask layer 15 has the width W15 that is smaller than the width W7 of the magnetization free layer 7. Thus, when the side wall portion 17 is disposed, the shadow effect of the mask layer 15 on the magnetization free layer 7 is reduced, and the side wall portion 17 is easily disposed outside the side surface 7c of the magnetization free layer 7. In the present specific example, the TMR element 1 is completed by further forming an upper electrode layer 31 on the mask layer 15 and the side wall portion 17.

Figure 16:
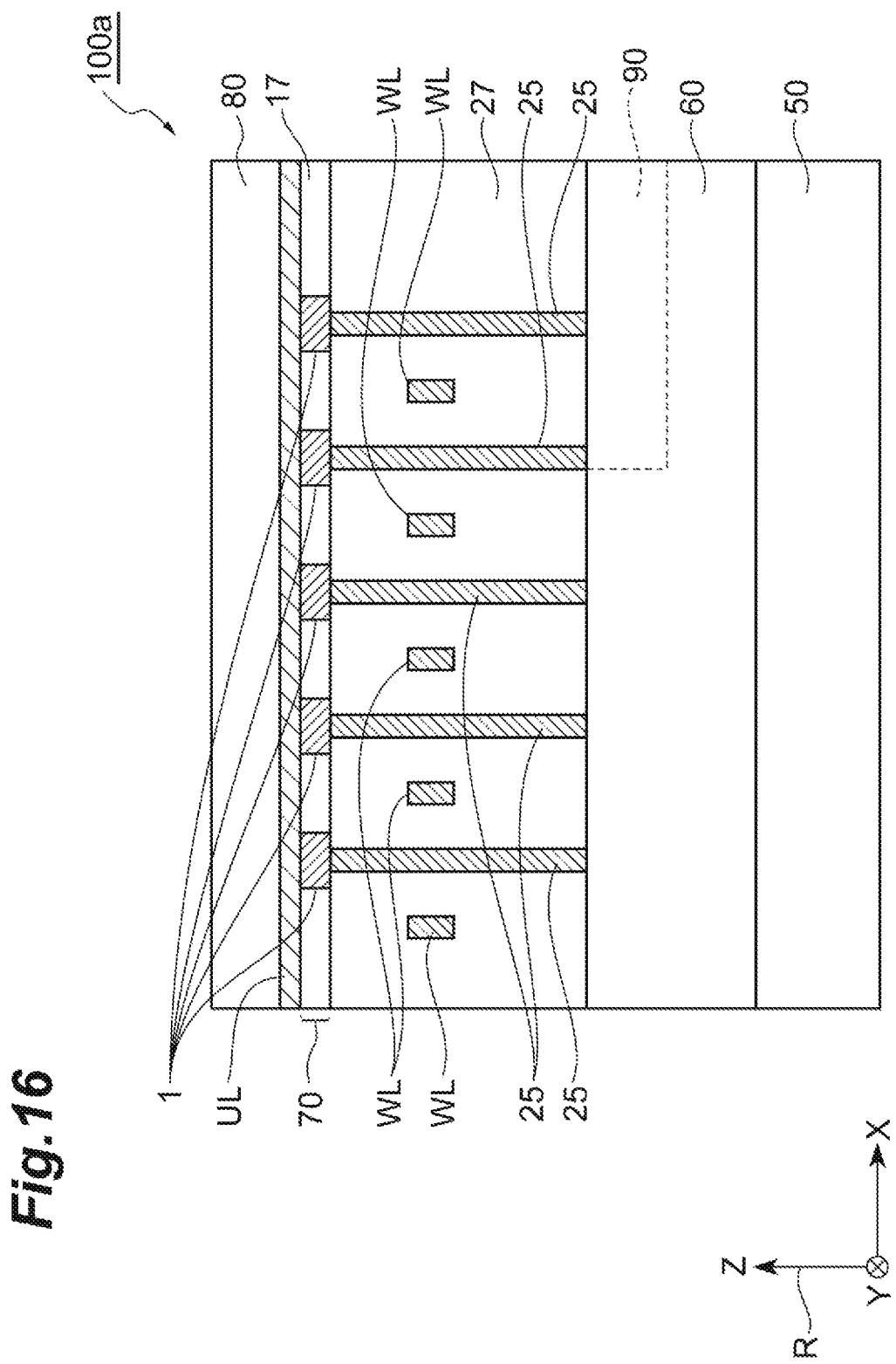
FIG. 16 is a schematic view of a vertical cross section of an MRAM according to a modification example of the embodiment.

FIG. 16 is a schematic view of a vertical cross section of an MRAM according to a modification example of the present embodiment. An MRAM 100a according to the present modification example is different from the MRAM 100 of the basic aspect of the present embodiment in that the MRAM 100a further includes a processor 90. In the MRAM 100a, an MRAM part is formed as a part of a step of forming the circuit of the processor 90. Thus, the processor 90 and the MRAM part of the MRAM 100a are integrated. Thus, the MRAM 100a is a built-in memory. Accordingly, the speed of data exchange between the processor 90 and the MRAM part is increased. In addition, since the MRAM part is installed above the processor 90, the density of the whole device can be increased.

REFERENCE SIGNS LIST

1 TMR ELEMENT
3 REFERENCE LAYER
5 TUNNEL BARRIER LAYER
7 MAGNETIZATION FREE LAYER
9 PERPENDICULAR MAGNETIZATION INDUCING LAYER
15 MASK LAYER
17 SIDE WALL PORTION

The invention claimed is:

1. A tunnel magnetoresistive effect element comprising:
   a reference layer;
   a tunnel barrier layer;
   a perpendicular magnetization inducing layer; and
   a magnetization free layer stacked along a stack direction between the tunnel barrier layer and the perpendicular magnetization inducing layer,
   wherein the perpendicular magnetization inducing layer imparts magnetic anisotropy along the stack direction to the magnetization free layer, and
   all widths of the magnetization free layer are smaller than (1) all widths of the tunnel barrier layer and (2) all widths of the perpendicular magnetization inducing layer.

2. The tunnel magnetoresistive effect element according to claim 1,
   wherein a minimum width of the magnetization free layer is smaller than a maximum width of the tunnel barrier layer or a maximum width of the perpendicular magnetization inducing layer by 4 nm or greater.

3. The tunnel magnetoresistive effect element according to claim 2, further comprising:
   a side wall portion covering side surfaces of the tunnel barrier layer, the magnetization free layer, and the perpendicular magnetization inducing layer,
   wherein the side wall portion includes an insulation material.

4. The tunnel magnetoresistive effect element according to claim 2,
   wherein each of the tunnel barrier layer and the perpendicular magnetization inducing layer is formed of MgO or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In).

5. The tunnel magnetoresistive effect element according to claim 2, further comprising:
a mask layer that disposed on the perpendicular magnetization inducing layer,
wherein the mask layer has a width that is smaller than the width of the magnetization free layer, and includes a heavy metal of atomic number 72 or greater.

6. A magnetic memory comprising:
the tunnel magnetoresistive effect element according to claim 2, as a storage element.

7. A built-in memory comprising:
the magnetic memory according to claim 6.

8. The tunnel magnetoresistive effect element according to claim 1, further comprising:
a side wall portion covering side surfaces of the tunnel barrier layer, the magnetization free layer, and the perpendicular magnetization inducing layer,
wherein the side wall portion includes an insulation material.

9. The tunnel magnetoresistive effect element according to claim 8,
wherein the insulation material includes a nitride material.

10. The tunnel magnetoresistive effect element according to claim 9,
wherein each of the tunnel barrier layer and the perpendicular magnetization inducing layer is formed of MgO or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In).

11. The tunnel magnetoresistive effect element according to claim 9, further comprising:
a mask layer that disposed on the perpendicular magnetization inducing layer,
wherein the mask layer has a width that is smaller than the width of the magnetization free layer, and includes a heavy metal of atomic number 72 or greater.

12. The tunnel magnetoresistive effect element according to claim 8,
wherein each of the tunnel barrier layer and the perpendicular magnetization inducing layer is formed of MgO or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In).

13. The tunnel magnetoresistive effect element according to claim 8, further comprising:
a mask layer that disposed on the perpendicular magnetization inducing layer,
wherein the mask layer has a width that is smaller than the width of the magnetization free layer, and includes a heavy metal of atomic number 72 or greater.

14. The tunnel magnetoresistive effect element according to claim 1,
wherein each of the tunnel barrier layer and the perpendicular magnetization inducing layer is formed of MgO or an oxide material that has a spinel structure represented by General Formula $AB_2O_4$ (in the formula, A is at least one kind of element selected from a group consisting of Mg and Zn, and B is at least one kind of element selected from a group consisting of Al, Ga, and In).

15. The tunnel magnetoresistive effect element according to claim 14,
wherein the tunnel barrier layer and the perpendicular magnetization inducing layer are formed of an oxide material that has a spinel structure represented by General Formula $AB_2O_4$, and at least one of an A site or a B site of the spinel structure is occupied by a plurality of elements.

16. The tunnel magnetoresistive effect element according to claim 14,
wherein the tunnel barrier layer and the perpendicular magnetization inducing layer are formed of an oxide material that has a spinel structure represented by General Formula $AB_2O_4$, and each of an A site and a B site of the spinel structure is occupied by a plurality of elements.

17. The tunnel magnetoresistive effect element according to claim 14, further comprising:
a mask layer that disposed on the perpendicular magnetization inducing layer,
wherein the mask layer has a width that is smaller than the width of the magnetization free layer, and includes a heavy metal of atomic number 72 or greater.

18. The tunnel magnetoresistive effect element according to claim 1, further comprising:
a mask layer that disposed on the perpendicular magnetization inducing layer,
wherein the mask layer has a width that is smaller than the width of the magnetization free layer, and includes a heavy metal of atomic number 72 or greater.

19. A magnetic memory comprising:
the tunnel magnetoresistive effect element according to claim 1, as a storage element.

20. A built-in memory comprising:
the magnetic memory according to claim 19.

* * * * *